US006534363B2

United States Patent
Kim

(10) Patent No.: US 6,534,363 B2
(45) Date of Patent: Mar. 18, 2003

(54) HIGH VOLTAGE OXIDATION METHOD FOR HIGHLY RELIABLE FLASH MEMORY DEVICES

(75) Inventor: Hyeon-Seag Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/803,400

(22) Filed: Mar. 12, 2001

(65) Prior Publication Data

US 2002/0127799 A1 Sep. 12, 2002

(51) Int. Cl.[7] .................. H01L 21/336; H01L 21/3205; H01L 21/31
(52) U.S. Cl. ..................... 438/258; 438/287; 438/594; 438/775
(58) Field of Search .................. 438/258, 287, 438/587, 593, 594, 775, 776, 777

(56) References Cited

U.S. PATENT DOCUMENTS

| | | | | |
|---|---|---|---|---|
| 4,651,406 A | * | 3/1987 | Shimizu et al. ............... 29/571 |
| 5,596,218 A | * | 1/1997 | Soleimani et al. .......... 257/369 |
| 5,861,347 A | * | 1/1999 | Maiti et al. .................. 438/787 |
| 6,136,654 A | * | 10/2000 | Kraft et al. .................. 438/287 |
| 6,162,683 A | * | 12/2000 | Chen ............................ 438/258 |
| 6,165,846 A | * | 12/2000 | Carns et al. ................. 438/264 |
| 6,184,093 B1 | * | 2/2001 | Sung .......................... 438/275 |
| 6,204,159 B1 | * | 3/2001 | Chang et al. ................ 438/594 |
| 6,225,167 B1 | * | 5/2001 | Yu et al. ..................... 438/275 |

* cited by examiner

Primary Examiner—Matthew Smith
Assistant Examiner—Lex H. Malsawma
(74) Attorney, Agent, or Firm—Davis Chin

(57) ABSTRACT

A method for forming a high voltage gate oxide having a high quality and reliability for use with non-volatile memory devices is provided. Field oxide isolation regions are formed in the top surface of a semiconductor substrate so as to define a first active region, a second active region, and a third active region. A sacrificial oxide layer is formed on the top surface of the semiconductor layer and overlying the first through third active regions. The sacrificial oxide layer is removed from only the first active region. A tunnel oxide layer is formed over the first active region and over the sacrificial oxide layer overlying the second active region and the third active region. A floating gate structure is formed in the first active region. The tunnel oxide layer and the sacrificial oxide layer over the respective second active region and third active region are removed subsequent to forming the floating gate structure. A high voltage gate oxide layer is formed over the second active region and the third active region. The high voltage gate oxide layer is removed from only the third active region. A low voltage gate oxide layer is formed over the third active region. As a result, nitride contamination at the oxide-to-substrate interfaces in the second and third active regions has been eliminated.

20 Claims, 4 Drawing Sheets

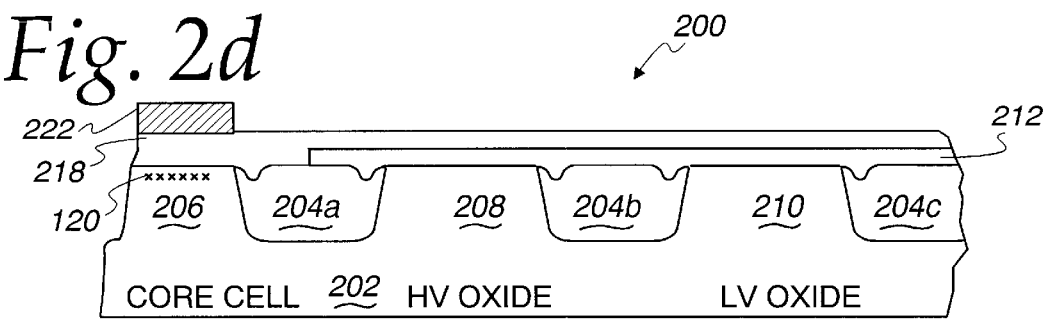
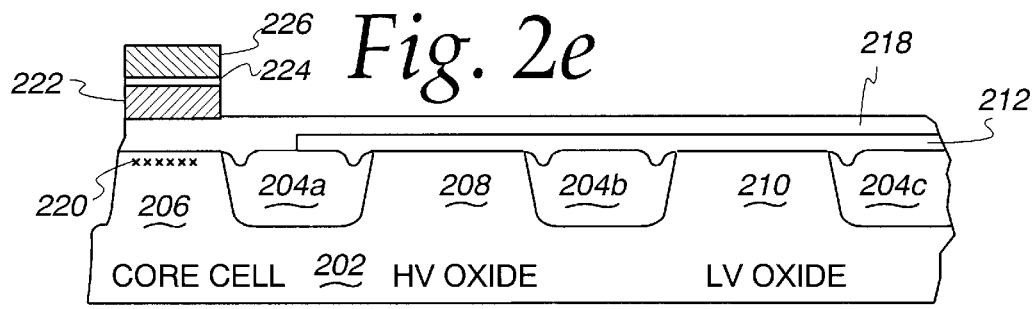
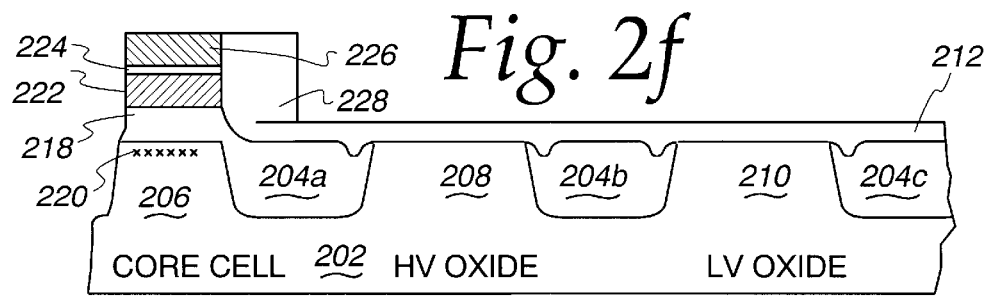
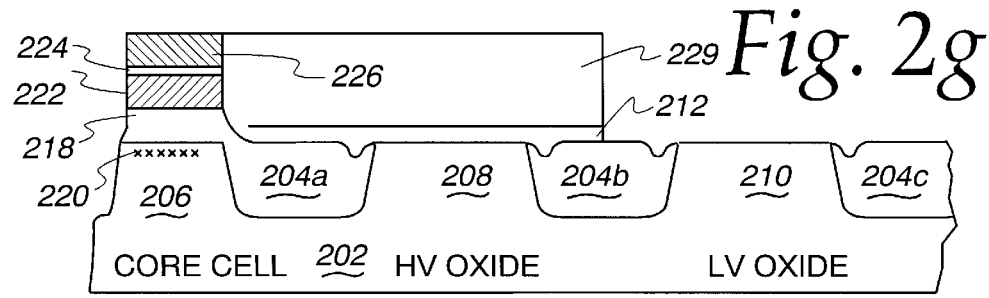
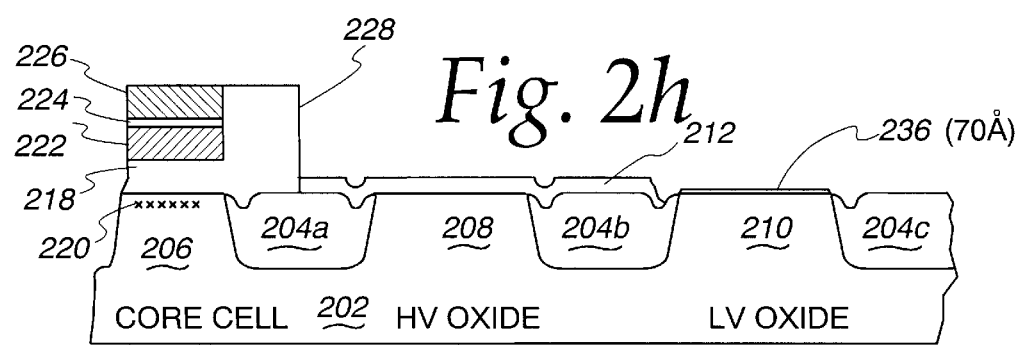

HIGH VOLTAGE OXIDATION METHOD FOR HIGHLY RELIABLE FLASH MEMORY DEVICES

BACKGROUND OF THE INVENTION

This invention relates generally to semiconductor integrated circuit manufacturing processes and more particularly, it relates to an improved method for forming a high voltage gate oxide for use with Flash EEPROM memory devices.

As is generally well-known in the semiconductor industry, there has been a continuing trend of integrating more and more different types of circuit devices onto a single semiconductor substrate. For example, the single semiconductor substrate may contain a floating gate memory device such as an Flash electrically, erasable programmable read-only (EEPROM) memory cell together with one or more high voltage devices and/or low voltage (logic) devices. A tunnel oxide formation used in the floating gate memory device requires typically a thin oxide layer of 100 Å or less in thickness. Due to its thinness and being subjected to high stress during operation, the tunnel oxide layer must be made robust so as to improve yield and reliability. Thus, the semiconductor industry has exposed the tunnel oxide layer to a nitrogen-containing environment in order to enhance its performance.

Unfortunately, in view of the high level of integration, while the nitrogen exposure process will improve the performance of the tunnel oxide layer in the floating gate memory device, it will substantially degrade the stability and performance of the peripheral (high voltage and low voltage) oxides subsequently formed for use in the high voltage devices and/or low voltage (logic) devices. This is due to the fact that nitrogen-containing surfaces are also created in the areas where the high and low voltage devices are to be subsequently formed as well as in the tunnel oxide layer of the single substrate. As a result, during the oxidation steps for forming the high voltage and low voltage oxides the remnant nitride in the nitrogen-containing surfaces will induce added defects or contamination in the peripheral oxides which adversely affects performance, such as reducing the breakdown voltage.

Therefore, there is still needed an improved method for forming peripheral oxides of a high quality and reliability for use with a Flash EEPROM memory device. It would be expedient that the method for forming the peripheral oxides be capable of being implemented with only minor modifications to the conventional EEPROM fabrication process. This is achieved in the present invention by forming either a sacrificial oxide layer or a high voltage oxide layer prior to the tunnel oxidation step so as to prevent degradation of the peripheral oxides subsequently formed.

SUMMARY OF THE INVENTION

Accordingly, it is a general object of the present invention to provide an improved method for forming a high voltage gate oxide which overcomes the problems encountered in the conventional EEPROM fabrication process.

It is an object of the present invention to provide an improved method for forming peripheral oxides of a high quality and reliability for use with a Flash EEPROM memory device.

It is another object of the present invention to provide a method for forming peripheral oxides of a high quality which can be implemented with only minor modifications to the conventional EEPROM fabrication process.

It is still another object of the present invention to provide a method for forming peripheral oxides of a high quality which includes an additional step of growing a sacrificial oxide layer prior to the step of performing a tunnel oxidation.

It is yet still another object of the present invention to provide a method for forming peripheral oxides of a high quality which includes an additional step of growing a high voltage gate oxide layer initially and etching off the same only above the tunnel oxide area prior to the step of performing a tunnel oxidation.

In accordance with a preferred embodiment of the present invention, there is provided a method for forming a high voltage gate oxide having a high quality and reliability for use with non-volatile memory devices. Field oxide isolation regions are formed in the top surface of a semiconductor substrate so as to define a first active region, a second active region, and a third active region. A sacrificial oxide layer is formed on the top surface of the semiconductor substrate and overlying the first active region, the second active region, and the third active region. The sacrificial oxide layer is removed from only the first active region. A tunnel oxide layer is then formed over the first active region and over the sacrificial oxide layer overlying the second active region and the third active region. A floating gate electrode, a dielectric layer over the floating gate electrode, and a control gate electrode over the dielectric layer are formed in the first active region so as to define a floating gate structure. The tunnel oxide layer and the sacrificial oxide layer over the respective second active region and the third active region are removed subsequent to the forming of the floating gate structure. A high voltage gate oxide layer is formed over the second active region and the third active region. The high voltage oxide layer is then removed from only the third active region. A low voltage gate oxide layer is formed over the third active region.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIGS. 2(a) through 2(h) are cross-sectional views of the fabrication steps of a second embodiment for forming peripheral oxides for use with a Flash EEPROM memory device in accordance with the teachings of the present invention.

DESCRIPTION OF THE PREFERRED EMBODIMENT

As was previously pointed out, when the tunnel oxide over floating gate area is exposed to a nitrogen-containing environment so as to improve reliability the peripheral oxides (high voltage and low voltage oxide areas) on the single semiconductor substrate will become degraded due to the remnant nitride at the high voltage/low voltage oxide-to-substrate interfaces. The purpose of this invention is to provide an improved method of forming peripheral oxides of a high quality and reliability for use with the Flash EEPROM memory device. In view of this, the inventor of the instant invention has utilized either a sacrificial oxidation step or a high voltage oxidation step prior to the tunnel oxidation step which can be easily added to the conventional EEPROM memory device fabrication process in order to achieve this result. Accordingly, the required modifications to the standard EEPROM fabrication process are minimal and thus do not increase significantly the manufacturing time and cost.

Figure 1A:
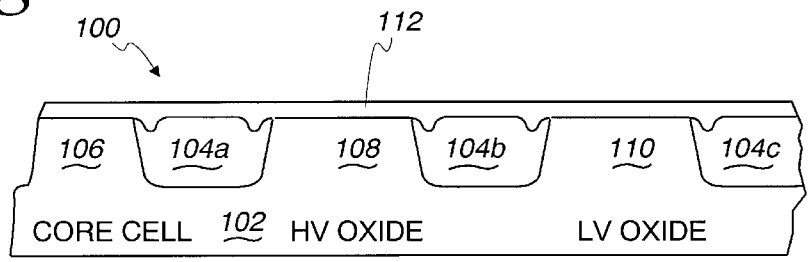
FIGS. 1(a) through 1(i) are cross-sectional views of the fabrication steps for forming peripheral oxides for use with a Flash EEPROM memory device, according to the principles of the present invention.

Referring now in detail to the drawings, there are illustrated in FIGS. 1(a) through 1(i) the fabrication steps for manufacturing peripheral oxides of a high quality and reliability for use with a Flash EEPROM memory device on a single semiconductor integrated circuit substrate, in accordance with the principles of the present invention. In FIG. 1(a), there is shown a semiconductor integrated circuit device 100 which includes preferably a p-type silicon substrate 102 and a plurality of field oxide isolation regions 104a, 104b, and 104c. While the isolation regions 104a–104c are depicted as being formed utilizing a shallow trench isolation (STI) process, it should be apparent to those skilled in the art that a conventional local oxidation of silicon (LOCOS) technology could have been used. These isolation regions serve to create a plurality of active areas 106, 108, 110 disposed across the surface of the silicon substrate 102.

In particular, the active area 106 defines a first active region which will be used to form a non-volatile or floating gate memory device, such as an EEPROM memory core cell or a Flash EEPROM memory device. The active area 108 defines a second active region which will be used to form high voltage (HV) transistors and/or other high voltage circuit elements. The active area 110 defines a third active region which will be used to form low voltage (LV) circuit elements, such as low voltage transistors and/or logic devices.

Unlike the conventional EEPROM process where the N$_2$O tunnel oxidation step is the very first step performed in the process, the inventor of the present invention has purposely added a sacrificial oxidation step to the conventional EEPROM process prior to the tunnel oxidation step so as to improve the quality and reliability of the peripheral gate oxides to be subsequently formed. The sacrificial oxidation step serves to prevent the nitride concentration at the oxide-to-substrate interfaces in the respective second and third active regions 106 and 108, thereby reducing the nitride-induced defects. As can be seen, a sacrificial oxide layer 112 is formed over the substrate 102 so as to overlie the first through third active regions 106–110. This is illustrated in FIG. 1(a).

Figure 1B:
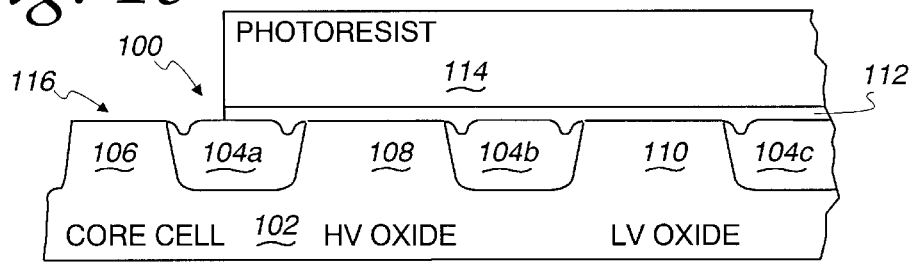
Figure 1C:
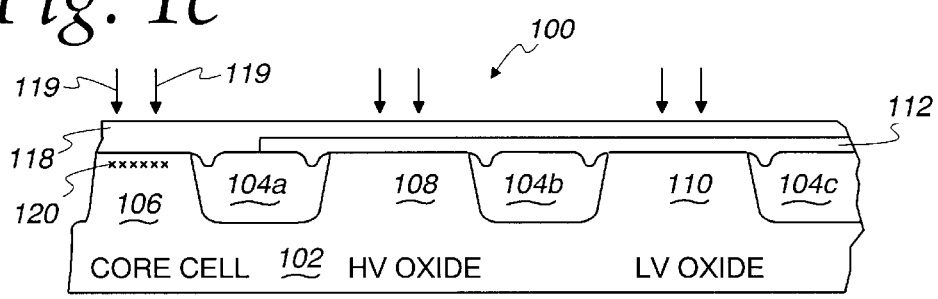

As depicted in FIG. 1(b), an oxide-nitride-oxide (ONO) masking layer such as a photoresist layer 114 is applied and lithographically patterned so as to expose a portion of the sacrificial oxide layer overlying the first active region 106, followed by an etch step to remove the exposed sacrificial oxide layer. As a result, the exposed surface 116 over the first active region 106 is shown. The photoresist layer 114 protects the sacrificial oxide layer 112 not overlying the first active region 106. Next, the photoresist layer 114 is removed and a N$_2$O tunnel oxidation is performed so as to thermally grow a tunnel oxide layer 118 having a thickness of 100 Å or less. This is shown in FIG. 1(c). Typically, the tunnel oxide layer 118 is formed in a dry oxide process at a temperature of about 900° C.

Generally, either after the formation of the tunnel oxide layer 118 or in-situ during formation of the tunnel oxide layer, the oxide layer 118 is exposed to a nitrogen-containing environment 119 so as to form nitrogen atoms 120 into only the tunnel oxide-to-substrate interface over the first active region 106. If the sacrificial oxide layer 112 of the instant invention overlying the respective second and third active regions 108, 110 was not present, there would also be nitrogen atoms formed into the surfaces of the active regions 108,110 which would degrade the peripheral gate oxides to be subsequently formed thereon.

Figure 1D:
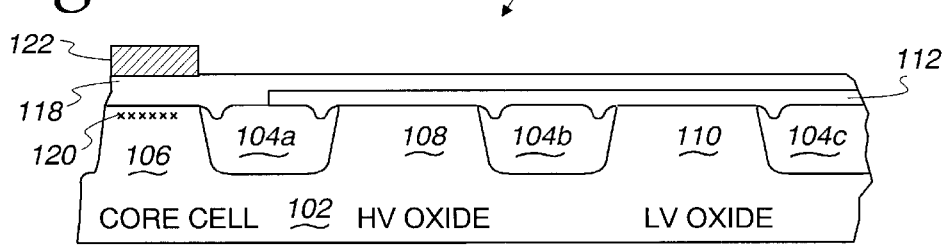
Figure 1E:
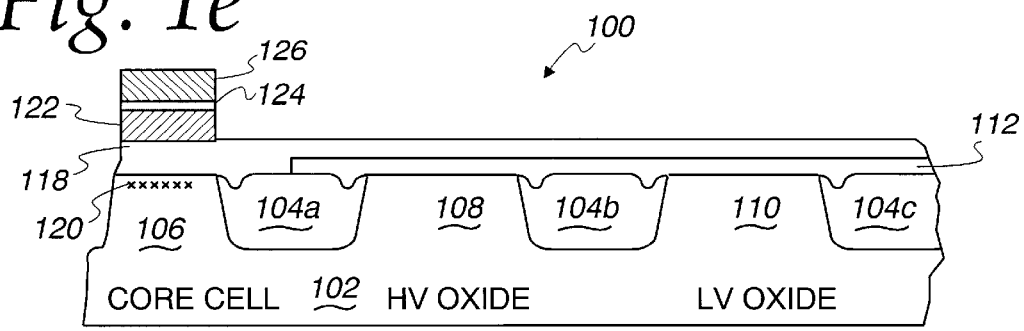

Next, a first layer of polysilicon material or the like is deposited over the substrate which is then patterned and etched in a conventional manner so as to form a floating gate electrode 122 overlying the portion of the tunnel oxide in the first active region 106, as illustrated in FIG. 1(d). After the formation of the floating gate electrode 122, an inter-poly dielectric layer 124 consisting preferably of an oxide-nitride-oxide (ONO) stack is formed over the gate electrode 122 using repeatedly conventional techniques, such as sputtering, chemical vapor deposition (CVD), or thermal oxidation. Thereafter, a second layer of polysilicon material or the like is deposited over the substrate which is then patterned and etched in a conventional manner so as to form a control gate electrode 126. The tunnel oxide layer 118, floating gate electrode 122, dielectric layer 124, and control gate electrode 126 define a floating gate structure. This is depicted in FIG. 1(e).

Figure 1F:
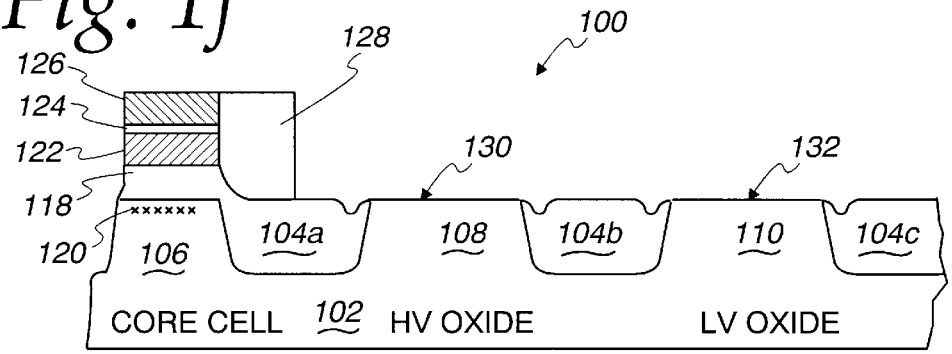
Figure 1G:
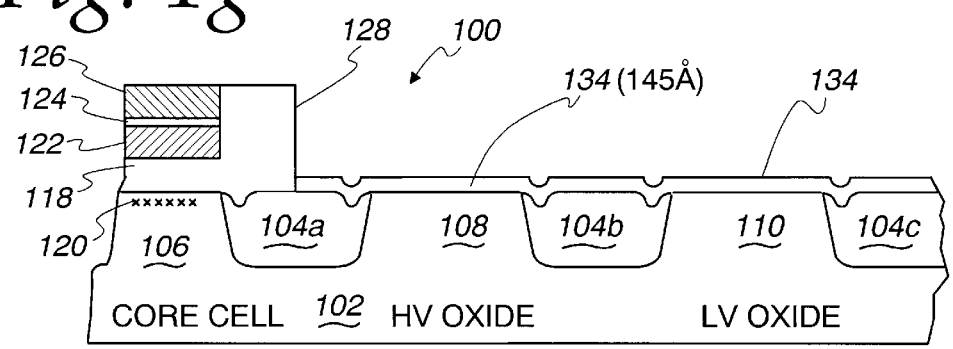

In FIG. 1(f), an ONO masking layer such as photoresist layer 128 is applied and lithographically patterned so as to expose the portion of the tunnel oxide layer 118 overlying the sacrificial oxide layer 112 in the active regions 108, 110, followed by etching processes used to remove the exposed tunnel oxide layer 118 as well as the underneath sacrificial oxide layer 112. As a result, the exposed surface 130 over the second active region 108 and the exposed surface 132 over the third active region 110 will not have any nitrogen atoms due to the N$_2$O tunnel oxidation step of FIG. 1(c) because of the previously applied sacrificial oxidation step in FIG. 1(a). Next, using the same photoresist layer 128 a high voltage (HV) oxidation is performed so as to grow a HV oxide layer 134 over the second and third active regions 108, 110. The thickness of the HV oxide layer 134 is approximately 145 Å or greater dependent upon the particular high voltage application. Typically, the HV oxide layer 134 is formed in a dry oxide process at a temperature of about 900° C. Alternatively, the HV oxide layer 134 may be formed in a wet oxidation process at a temperature of about 800° C. This is shown in FIG. 1(g).

Figure 1H:
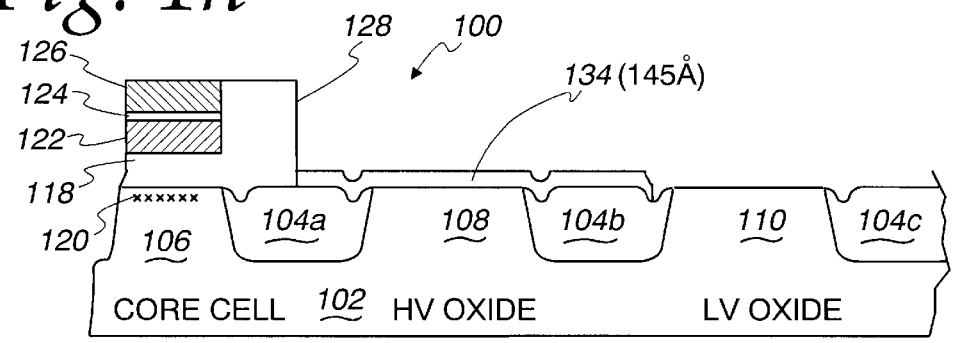
Figure 1I:
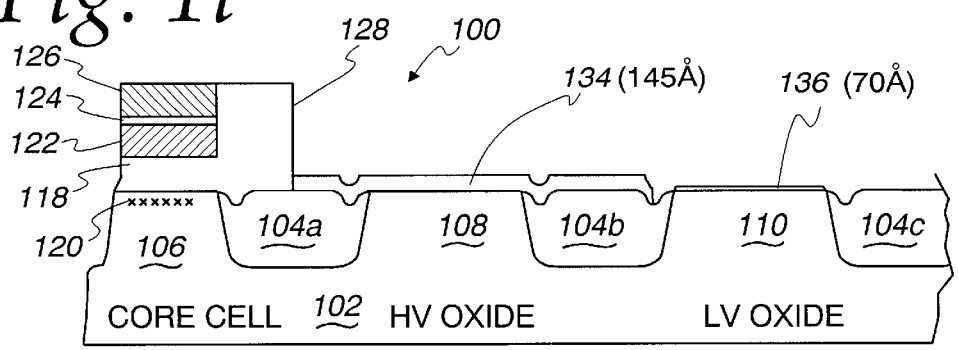

In FIG. 1(h), there is illustrated the conventional masking and etching processes which are used to remove only the thicker HV oxide layer 134 overlying the third active region 110. Thereafter, a low voltage (LV) oxidation is performed so as to grow a LV oxide layer 136 over the third active region 110. The thickness of the LV oxide layer 136 is approximately 70 Å or less dependent again upon the particular low voltage application. Typically, the LV oxide layer 136 is formed in a dry oxide process at a temperature of about 900° C. This resultant structure is depicted in FIG. 1(i).

While the fabrication process just described in FIGS. 1(a) through 1(i) perform adequately in preventing the nitride contamination in the peripheral oxide-to-substrate interfaces in the second and third active regions 108, 110, it would be expedient to be capable of achieving the same results with a reduced number of fabrication steps since each required step increases the manufacturing time and thus the production cost. Accordingly, the inventor has developed a simple way of achieving this result by eliminating the need of the high voltage oxidation/etch steps of FIGS. 1(g) and 1(h).

Figure 2A:
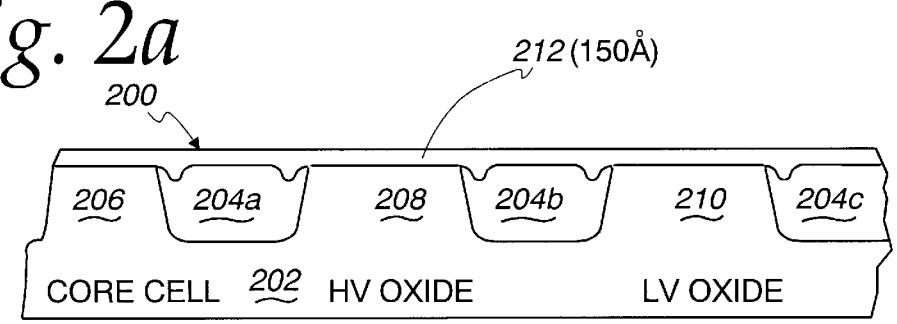

The fabrication steps of a second embodiment of the present invention for forming peripheral oxides for use with a Flash EEPROM memory cell will now be described. In FIG. 2(a), there is shown a semiconductor integrated circuit device 200 which includes preferably a p-type silicon substrate 202 and a plurality of field oxide isolation regions 204a, 204b, and 204c. While the isolation regions 204a–204c are depicted as being formed utilizing a shallow trench isolation (STI) process, it should be apparent to those skilled in the art that a conventional local oxidation of silicon (LOCOS) technology could have been used. These isolation regions serve to create a plurality of active areas 206, 208, 210 disposed across the surface of the silicon substrate 202.

More specifically, the active area 206 defines a first active region which will be used to form a floating gate memory device, such as an EEPROM memory core cell or a Flash EEPROM memory device. The active area 208 defines a second active region which will be used to form high voltage (HV) transistors and/or other high voltage circuit elements. The active area 210 defines a third active region which will be used to form low voltage (LV) circuit elements, such as low voltage transistors and/or logic devices.

In this second embodiment, the inventor of the present invention has purposely added a high voltage gate oxidation step to the conventional EEPROM process prior to the tunnel oxidation step so as to improve the quality and reliability of the peripheral gate oxides to be subsequently formed. The high voltage oxidation step serves to prevent the nitride concentration at the oxide-to-substrate interfaces in the second and third active regions 206 and 208, thereby reducing the nitride-induced defects. As will be noted, a high voltage oxide layer 212 is formed over the substrate 202 so as to overlie the first through third active regions 206, 208 and 210. This is illustrated in FIG. 2(a). The thickness of the high voltage oxide layer 212 is approximate 150 Å or greater dependent upon the particular high voltage application. The high voltage oxide layer 212 is preferably formed in a dry oxide process at a temperature of about 900° C. Alternatively, the high voltage oxide layer 212 may be formed in a wet oxidation process at a temperature of about 800° C.

Figure 2B:
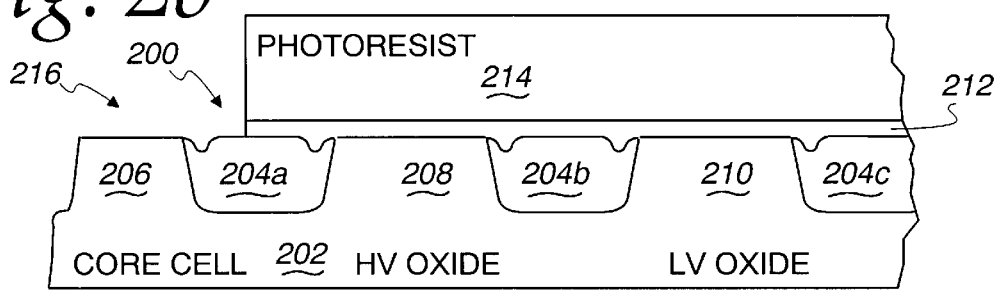
Figure 2C:
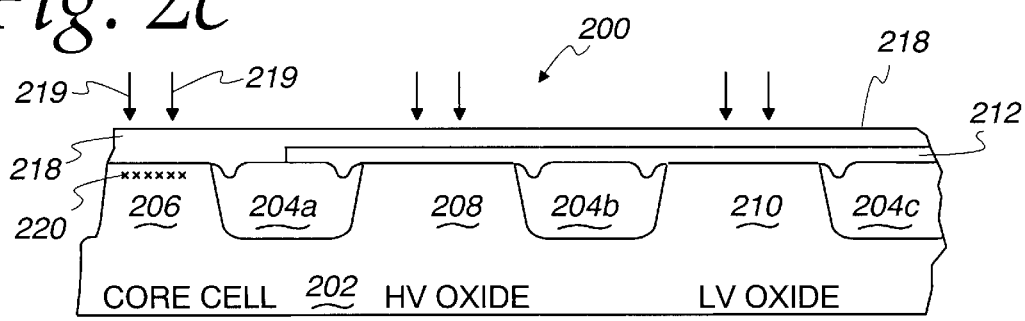

As depicted in FIG. 2(b), an oxide-nitride-oxide (ONO) masking layer such as a photoresist layer 214 is applied and lithographically patterned so as to expose a portion of the high voltage gate oxide layer 212 overlying the first active region 206, followed by an etch step to remove the exposed high voltage gate oxide layer. As a result, the exposed surface 216 over the first active region 206 is shown. The photoresist layer protects the high voltage oxide layer 212 not overlying the first active region 206. Next, the photoresist layer 214 is removed and a $N_2O$ tunnel oxidation is performed so as to thermally grow a tunnel oxide layer 218 having a thickness of 100 Å or less. This is shown in FIG. 2(c). Typically, the tunnel oxide layer 218 is formed in a dry oxide process at a temperature of about 900° C.

Generally, either after the formation of the tunnel oxide layer 218 or in-situ during the formation of the tunnel oxide layer, the oxide layer is exposed to a nitrogen-containing environment 219 so as to form nitrogen atoms 220 into only the tunnel oxide-to-substrate interface over the first active region 206. If the high voltage gate oxide layer 212 of the second embodiment overlying the second and third active regions 208, 210 was not present, there would also be nitrogen atoms formed into the surfaces of the active regions 208, 210 which would degrade the peripheral gate oxides to be subsequently formed thereon.

Next, a first layer of polysilicon material or the like is deposited over the substrate which is then patterned and etched in a conventional manner so as to form a floating gate electrode 222 overlying the portion of the tunnel oxide layer 218 in the first active region 206, as illustrated in FIG. 2(d). After the formation of the floating gate electrode 222, an inter-poly dielectric layer 224 consisting preferably of an oxide-nitride-oxide (ONO) stack is formed over the gate electrode 222 using repeatedly conventional techniques, such as sputtering, chemical vapor deposition (CVD), or thermal oxidation. Thereafter, a second layer of poly-silicon material or the like is deposited over the substrate which is then patterned and etched in a conventional manner so as to form a control gate electrode 226. The tunnel oxide layer 218, floating gate electrode 222, dielectric layer 224, and the control gate electrode 226 define a floating gate structure. This is depicted in FIG. 2(e).

In FIG. 2(f), an ONO masking layer such as photoresist layer 228 is applied and lithographically patterned so as to expose the portion of the tunnel oxide layer overlying the high voltage oxide layer 212 in the active regions 208, 210, followed by an etching process used to remove only the exposed tunnel oxide layer 218. As a result, there is still provided the high voltage oxide layer 212 overlying the active regions 208, 210. The active regions 208, 210 will not have any nitrogen atoms due to the $N_2O$ tunnel oxidation step of FIG. 2(c) because of the previously applied high voltage oxidation step in FIG. 2(a). Next, the photoresist layer 228 is removed and another photoresist layer 229 is applied and lithographically patterned so as to expose only the high voltage oxide layer overlying the third active region 210, followed by an etching process used to remove the exposed high voltage oxide layer. This is shown in FIG. 2(g).

In view of this, it should be noted that the high voltage gate oxidation step of FIG. 1(g) and the etch step of FIG. 1(h) can be eliminated since the high voltage gate oxide layer 212 grown in the initial step of FIG. 2(a) was not removed from the second active region 208 in the etch step of FIG. 2(g). Thereafter, a low voltage (LV) oxidation is performed so as to grow a low voltage oxide layer 236 over the third active region 210. The thickness of the low voltage oxide layer 236 is approximately 70 Å or less dependent again on the particular low voltage application. Typically, the low voltage gate oxide layer 236 is formed in a dry oxide process at a temperature of about 900° C. This is illustrated in FIG. 2(h). By comparing FIGS. 2(a)–2(h) with FIGS. 1(a)–1(i), it can be seen that this second embodiment of the present invention has a reduced number of fabrication steps, thereby decreasing manufacturing time and cost.

From the foregoing detailed description, it can thus be seen that the present invention provides a method for forming a high voltage gate oxide having a high quality and reliability for use with a non-volatile memory device. This is accomplished in the present invention by utilizing either a sacrificial oxidation step or a high voltage oxidation step prior to the $N_2O$ tunnel oxidation step so as to prevent degradation due to the remnant nitride at the high voltage/ low voltage oxide-to-substrate interfaces. Since the required modifications to the standard EEPROM fabrication process are minimal, the manufacturing time and costs are not increased significantly.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A method for forming a high voltage gate oxide having a high quality and reliability for use with non-volatile memory devices, said method comprising the steps of:

providing a semiconductor substrate having a top surface;

forming field oxide isolation regions in the top surface of the semiconductor substrates so as to define a first active region, a second active region, and a third active region;

forming a sacrificial oxide layer on the top surface of the semiconductor substrate and overlying the first active region, the second active region, and the third active region;

removing the sacrificial oxide layer from only the first active region;

forming a tunnel oxide layer over the first active region and over the sacrificial oxide layer overlying the second active region and the third active region;

forming a floating gate structure in the first active region;

exposing the tunnel oxide layer to a nitrogen-containing environment so as to form nitrogen atoms into only the tunnel oxide-to-substrate interface over the first active region subsequent to the formation of the tunnel oxide layer;

removing the tunnel oxide layer and the sacrificial oxide layer over the respective second active region and the third active region subsequent to forming the floating gate structure;

forming a high voltage gate oxide layer over the second active region and the third active region; removing the high voltage gate oxide layer from only the third active region; and forming a low voltage gate oxide layer over the third active region.

2. A method for forming a high voltage gate oxide as claimed in claim 1, wherein the step of forming the tunnel oxide layer includes the step of thermally growing the tunnel oxide layer to a thickness of 100 Å or less.

3. A method for forming a high voltage gate oxide as claimed in claim 2, wherein the step of growing the tunnel oxide layer is performed in a dry oxide process at a temperature of about 900° C.

4. A method for forming a high voltage gate oxide as claimed in claim 3, wherein the step of forming the high voltage gate oxide layer includes the step of thermally growing the high voltage oxide layer to a thickness of 145 Å or greater.

5. A method for forming a high voltage gate oxide as claimed in claim 4, wherein the step of growing the high voltage oxide layer is performed in one of a dry oxide process at a temperature of about 900° C. and a wet oxidation process at a temperature of about 800° C.

6. A method for forming a high voltage gate oxide as claimed in claim 5, wherein the step of forming the low voltage gate oxide layer includes the step of thermally growing the low voltage gate oxide layer to a thickness of 70 Å or less.

7. A method for forming a high voltage gate oxide as claimed in claim 6, wherein the step of growing the low voltage gate oxide layer is performed in a dry oxide process at a temperature of about 900° C.

8. A method for forming a high voltage gate oxide as claimed in claim 7, wherein the first active region is used to form the non-volatile memory device.

9. A method for forming a high voltage gate oxide as claimed in claim 8, wherein the second active region is used to form high voltage transistors and/or other high voltage circuit elements.

10. A method for forming a high voltage gate oxide as claimed in claim 9, wherein the third active region is used to form low voltage transistors and/or logic devices.

11. A method for forming a high voltage gate oxide having a high quality and reliability for use with non-volatile memory devices, said method comprising the steps of:

providing a semiconductor substrate having a top surface;

forming field oxide isolation regions in the top surface of the semiconductor substrates so as to define a first active region, a second active region, and a third active region;

forming a high voltage oxide layer on the top surface of the semiconductor substrate and overlying the first active region, the second active region, and the third active region;

removing the high voltage oxide layer from only the first active region;

forming a tunnel oxide layer over the first active region and over the high voltage oxide layer overlying the second active region and the third active region;

exposing the tunnel oxide layer to a nitrogen-containing environment so as to form nitrogen atoms into only the tunnel oxide-to-substrate interface over the first active region subsequent to the formation of the tunnel oxide layer;

forming a floating gate structure in the first active region;

removing the tunnel oxide layer over the respective second active region and the third active region subsequent to forming the floating gate structure;

removing the high voltage gate oxide layer from only the third active region; and forming a low voltage gate oxide layer over the third active region.

12. A method for forming a high voltage gate oxide as claimed in claim 11, wherein the step of forming the high voltage gate oxide layer includes the step of thermally growing the high voltage oxide layer to a thickness of 150 Å or greater.

13. A method for forming a high voltage gate oxide as claimed in claim 12, wherein the step of growing the high voltage oxide layer is performed in one of a dry oxide process at a temperature of about 900° C. and a wet oxidation process at a temperature of about 800° C.

14. A method for forming a high voltage gate oxide as claimed in claim 13, wherein the step of forming the tunnel oxide layer includes the step of thermally growing the tunnel oxide layer to a thickness of 100 Å or less.

15. A method for forming a high voltage gate oxide as claimed in claim 14, wherein the step of growing the tunnel oxide layer is performed in a dry oxide process at a temperature of about 900° C.

16. A method for forming a high voltage gate oxide as claimed in claim 15, wherein the step of forming the low voltage gate oxide layer includes the step of thermally growing the low voltage gate oxide layer to a thickness of 70 Å or less.

17. A method for forming a high voltage gate oxide as claimed in claim 16, wherein the step of growing the low voltage gate oxide layer is performed in a dry oxide process at a temperature of about 900° C.

18. A method for forming a high voltage gate oxide as claimed in claim 17, wherein the first active region is used to form the non-volatile memory device.

19. A method for forming a high voltage gate oxide as claimed in claim 18, wherein the second active region is used to form high voltage transistors and/or other high voltage circuit elements.

20. A method for forming a high voltage gate oxide as claimed in claim 19, wherein the third active region is used to form low voltage transistors and/or logic devices.

* * * * *